United States Patent
Kim et al.

(10) Patent No.: US 7,800,416 B2
(45) Date of Patent: Sep. 21, 2010

(54) DATA OUTPUT BUFFER CIRCUIT

(75) Inventors: Yong Ju Kim, Ichon (KR); Sung Woo Han, Ichon (KR); Hee Woong Song, Ichon (KR); Ic Su Oh, Ichon (KR); Hyung Soo Kim, Ichon (KR); Tae Jin Hwang, Ichon (KR); Hae Rang Choi, Ichon (KR); Ji Wang Lee, Ichon (KR); Jae Min Jang, Ichon (KR); Chang Kun Park, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/340,882

(22) Filed: Dec. 22, 2008

(65) Prior Publication Data

US 2010/0061167 A1    Mar. 11, 2010

(30) Foreign Application Priority Data

Sep. 10, 2008    (KR)    ...................... 10-2008-0089073

(51) Int. Cl.
    H03K 3/00    (2006.01)
(52) U.S. Cl. .......................... 327/108; 327/170; 326/87
(58) Field of Classification Search ................. 327/108, 327/170; 326/87
    See application file for complete search history.

(56) References Cited

U.S. PATENT DOCUMENTS

| 5,862,390 | A  | * | 1/1999  | Ranjan ....................... 713/300 |
|-----------|----|---|---------|----------------------------------------|
| 6,256,235 | B1 | * | 7/2001  | Lee ......................... 365/189.11 |
| 6,366,867 | B2 | * | 4/2002  | Sine et al. .................... 702/107 |
| 6,489,807 | B2 | * | 12/2002 | Genna et al. .................. 326/56 |
| 6,538,464 | B2 | * | 3/2003  | Muljono et al. ............... 326/27 |
| 6,586,973 | B2 | * | 7/2003  | Yokoyama et al. .......... 327/108 |
| 6,636,069 | B1 | * | 10/2003 | Muljono ...................... 326/30 |
| 6,768,363 | B2 | * | 7/2004  | Yoo et al. .................... 327/170 |
| 6,801,062 | B2 | * | 10/2004 | Okada ........................ 327/108 |
| 6,894,547 | B2 | * | 5/2005  | Takahashi .................... 327/170 |
| 6,924,669 | B2 | * | 8/2005  | Itoh et al. .................... 326/87 |
| 7,151,392 | B2 | * | 12/2006 | Lee ............................ 326/82 |
| 7,205,786 | B2 | * | 4/2007  | Ahmad ........................ 326/30 |
| 7,262,643 | B2 | * | 8/2007  | Hayashi et al. ............. 327/108 |
| 7,282,968 | B2 | * | 10/2007 | Lee ............................ 327/112 |
| 7,301,371 | B2 |   | 11/2007 | Kim |
| 7,339,409 | B2 |   | 3/2008  | Choi et al. |
| 7,362,127 | B2 | * | 4/2008  | Tokuhiro et al. .............. 326/30 |

FOREIGN PATENT DOCUMENTS

| JP | 2006-081183   | 3/2006 |
| KR | 1020070001484 | 1/2007 |
| KR | 1020080000424 | 1/2008 |

* cited by examiner

Primary Examiner—Kenneth B. Wells
(74) Attorney, Agent, or Firm—Baker & McKenzie LLP

(57) ABSTRACT

A data output circuit includes a pre-driving block configured to receive input data, generate a plurality of pull-up signals and pull-down signals, and change enable times of the pull-up signals and the pull-down signals in response to a plurality of control signals, and a main driving block configured to generate output data in response to the pull-up signals and the pull-down signals.

15 Claims, 4 Drawing Sheets

DATA OUTPUT BUFFER CIRCUIT

CROSS-REFERENCES TO RELATED APPLICATION

The present application claims priority under 35 U.S.C. §119(a) to Korean Application Number 10-2008-0089073, filed on Sep. 10, 2008, in the Korean Intellectual Property Office, which is incorporated herein by reference in its entirety as if set forth in full.

BACKGROUND

1. Technical Field

The embodiments described herein relate to a semiconductor memory device, and more particularly, to a data output circuit of a semiconductor memory device.

2. Related Art

In general, in a semiconductor memory device, specifically, a double data rate (DDR) SDRAM, data input and output operations are performed in synchronism with the rising edges, as well as the falling edges, of a clock so that double data input and output speeds can be obtained. In addition, conventional data output circuits of a semiconductor memory device output data through a main driver to a pad and include a pre-driver, which receives input with rising data and falling data, to drive the main driver.

A slew rate is an index that indicates how quickly the voltage level of an output signal changes with respect to time, and can be defined as having a slope that indicates the amount of change in a voltage level per unit time. For example, as the slew rate increases, the slope of the output signal increases and the level change of the signal quickly occurs. However, if the slew rate is too large, the generation of noise increases. Conversely, if the slew rate is too small, the generation of noise decreases, but the skew of data increases.

Accordingly, the pre-driver is configured to adequately adjust the slew rate of the data output by the main driver. In the conventional art, RC delay control using resistors and capacitors is commonly adopted in the pre-driver to change the turn-ON timing of the main driver, so that the slew rate of the data can be adjusted. However, because the RC delay control adjusts the turn-ON timing of the main driver with a certain amount of time delay, it is difficult to implement precise control in conformity with changes in environmental variables, such as process, voltage and temperature (PVT). Furthermore, the RC delay control is difficult to be applied for high speed input and output operations, and since the bandwidth of the pre-driver decreases due to the RC delay, jitter is likely to occur in the output of the main driver.

SUMMARY

A data output circuit capable of precisely adjusting a slew rate of the output of a main driver is described herein.

In one aspect, a data output circuit includes a pre-driving block configured to receive input data, generate a plurality of pull-up signals and pull-down signals, and change enable times of the pull-up signals and the pull-down signals in response to a plurality of control signals, and a main driving block configured to generate output data in response to the pull-up signals and the pull-down signals.

In another aspect, a data output circuit includes a first pre-driver configured to receive input data, generate first and second pull-up signals, and determine enable times of the first and second pull-up signals in response to first and third control signals, a second pre-driver configured to receive the input data, generate first and second pull-down signals, and determine enable times of the first and second pull-down signals in response to second and fourth control signals, and a main driving block configured to drive an output node in response to the first and second pull-up signals and the first and second pull-down signals, and generate output data through the output node.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
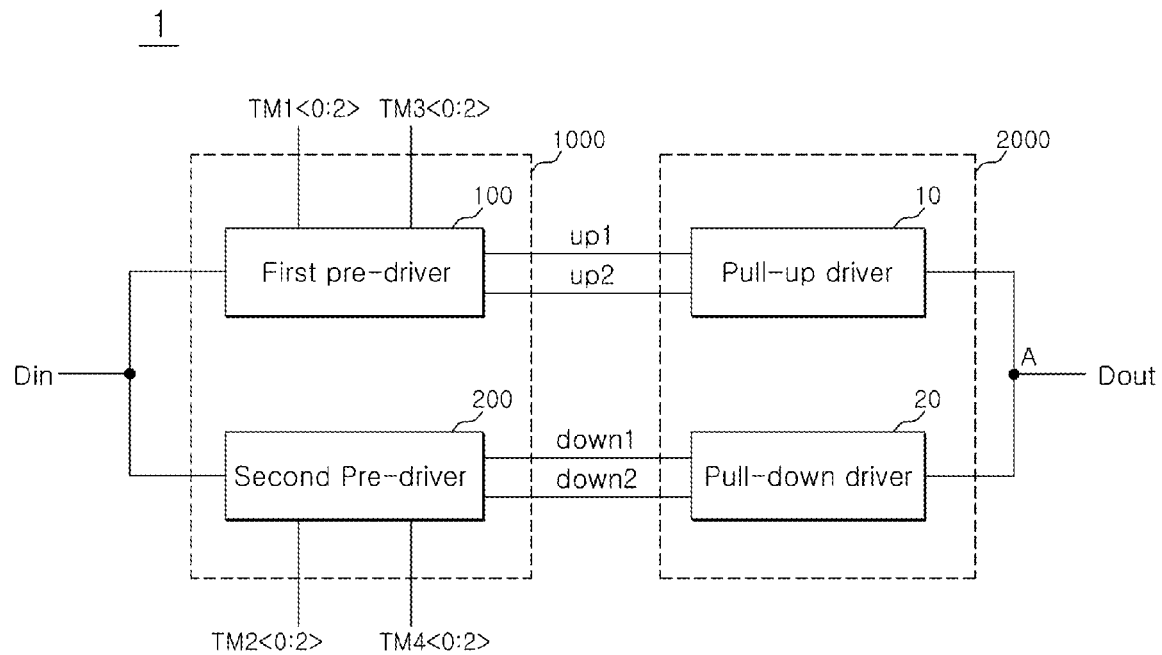
FIG. 1 is a schematic block diagram of an exemplary data output circuit according to one embodiment.

FIG. 1 is a schematic block diagram of an exemplary data output circuit according to one embodiment. In FIG. 1, the data output circuit 1 can be configured to include a pre-driving block 1000 and a main driving block 2000. The pre-driving block 1000 can receive input data 'Din', and can generate a plurality of pull-up signals 'up' and pull-down signals 'down'. Here, the pre-driving block 1000 can be configured to change the enable times of the plurality of pull-up signals 'up' and pull-down signals 'down' in response to a plurality of control signals 'TM'.

For example, the pre-driving block 1000 can receive the input data 'Din', and can generate first and second pull-up signals 'up1' and 'up2' and first and second pull-down signals 'down1' and 'down2' of which enable times can be determined in response to first to fourth control signals 'TM1' to 'TM4'. The first to fourth control signals 'TM1' to 'TM4' may include, for example, test mode signals using fuse sets or mode register set (MRS) signals.

In addition, the pre-driving block 1000 can include a first pre-driver 100 that can receive the first and third control signals 'TM1' and 'TM3', and can generate the first and second pull-up signals 'up1' and 'up2'. Furthermore, the pre-driving block 1000 can include a second pre-driver 200 that can receive the second and fourth control signals 'TM2' and 'TM4', and can generate the first and second pull-down signals 'down1' and 'down2'. Here, the enable time of the first pull-up signal 'up1' can be determined in response to the first control signals 'TM1', and the enable time of the second pull-up signal 'up2' can be determined in response to the third control signals 'TM3'. Moreover, the enable times of the first and second pull-down signals 'down1' and 'down2' can be determined in response to the second and fourth control signals 'TM2' and 'TM4', respectively. Alternatively, the first pre-driver 100 and the second pre-driver 200 may each receive an increased number of control signals 'TM', and can generate increased numbers of pull-up signals 'up' and pull-down signals 'down'. The pre-driving block 1000 can include the first pre-driver 100, wherein the second pre-driver 200 can adjust the enable times of the first and second pull-up signals 'up1' and 'up2' and the first and second pull-down signals 'down1' and 'down2', and can drive the main driving block 2000 with desired timing.

In FIG. 1, the main driving block 2000 can include a pull-up driver 10 and a pull-down driver 20. For example, the pull-up driver 10 can pull-up drive an output node A in response to the first and second pull-up signals 'up1' and 'up2', and the pull-down driver 20 can pull-down drive the output node A in response to the first and second pull-down signals 'down1' and 'down2'. In addition, output data 'Dout' can be generated through the output node A.

Figure 2:
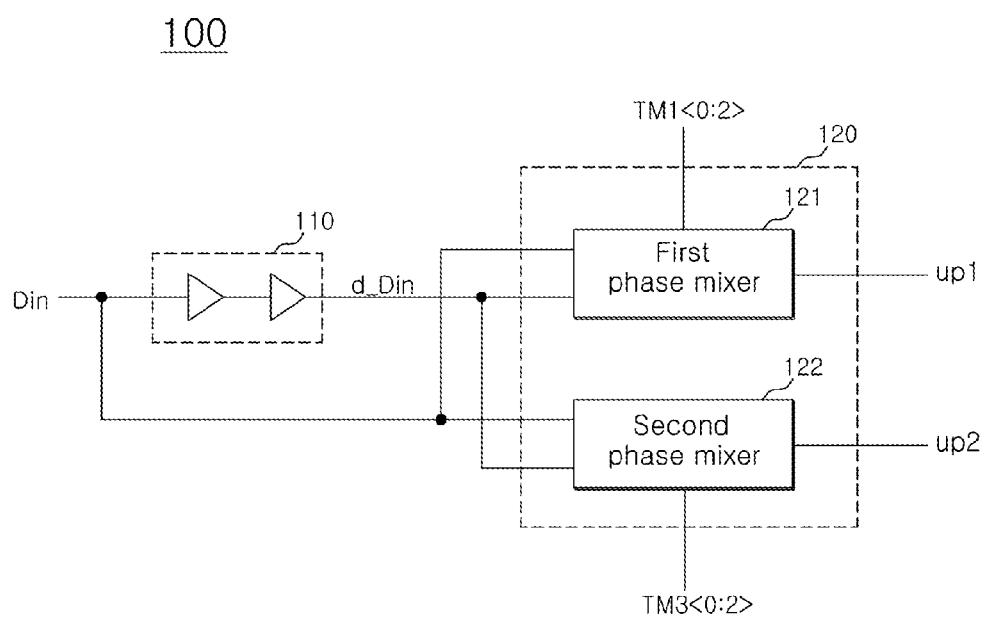
FIG. 2 is a schematic block diagram of an exemplary first pre-driver circuit capable of being implemented in the circuit of FIG. 1 according to one embodiment.

FIG. 2 is a schematic block diagram of an exemplary first pre-driver circuit capable of being implemented in the circuit of FIG. 1 according to one embodiment. In FIG. 2, the first pre-driver 100 can be configured to include a first delay section 110 and a pull-up phase mixing section 120. Here, the first delay section 110 can delay the input data 'Din' by a predetermined time, and can generate delayed input data 'd_Din'. For example, in a semiconductor memory device, the predetermined time may be about 30 to about 50 picoseconds (ps). In addition, the first delay section 110 can include a plurality of buffers so that the input data 'Din' can be delayed.

The pull-up phase mixing section 120 can include first and second phase mixers 121 and 122. For example, the first phase mixer 121 can receive the input data 'Din' and the delayed input data 'd_Din', and can determine the enable time of the first pull-up signal 'up1' in response to the first control signals 'TM1'. Similarly, the second phase mixer 122 can receive the input data 'Din' and the delayed input data 'd_Din', and can determine the enable time of the second pull-up signal 'up2' in response to the third control signals 'TM3'. Alternatively, the number of the phase mixers constituting the pull-up phase mixing section can be increased so that increased numbers of pull-up signals and pull-down signals can be generated.

Figure 3:
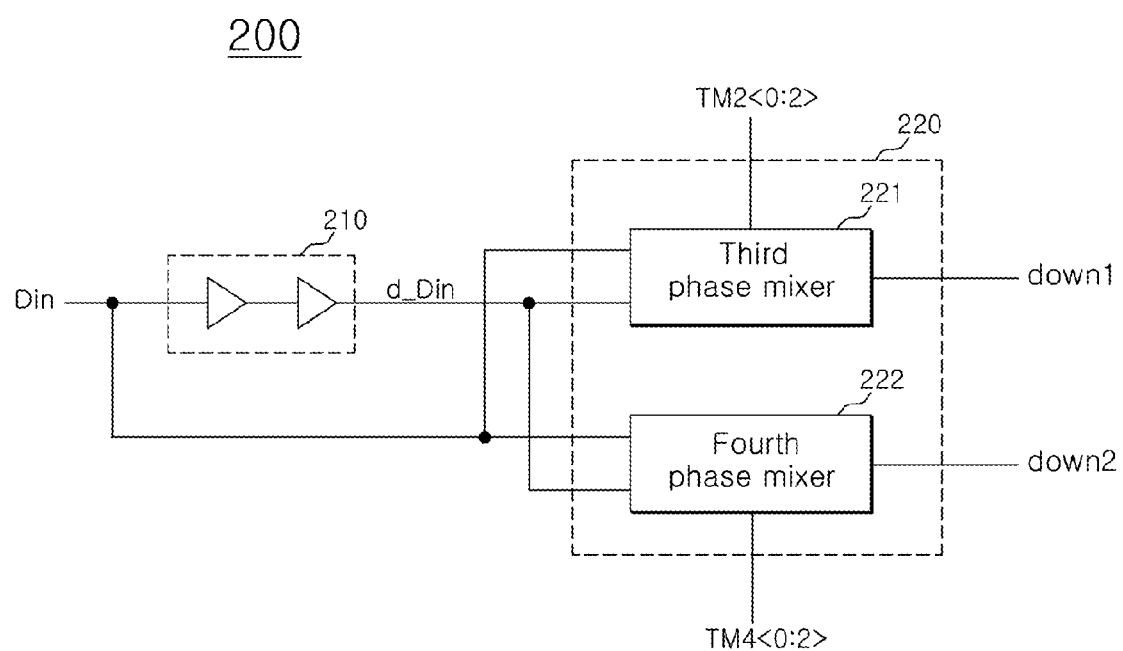
FIG. 3 is a schematic block diagram of an exemplary second pre-driver circuit capable of being implemented in the circuit of FIG. 1 according to one embodiment.

FIG. 3 is a schematic block diagram of an exemplary second pre-driver circuit capable of being implemented in the circuit of FIG. 1 according to one embodiment. In FIG. 3, similar to the first pre-driver 100, the second pre-driver 200 can be configured to include a second delay section 210 and a pull-down phase mixing section 220. Similar to the first delay section 110 of the first pre-driver 100, the second delay section 210 can delay the input data 'Din' by a predetermined time, and can generate delayed input data 'd_Din'. Here, the predetermined time can be set in substantially the same manner as in the first delay section 110, or can be optionally set to a different time.

The pull-down phase mixing section 220 can include third and fourth phase mixers 221 and 222. For example, the third phase mixer 221 can receive the input data 'Din' and the delayed input data 'd_Din', and can determine the enable time of the first pull-down signal 'down1' in response to the second control signals 'TM2'. Similarly, the fourth phase mixer 222 can receive the input data 'Din' and the delayed input data 'd_Din', and can determine the enable time of the second pull-down signal 'down2' in response to the fourth control signals 'TM4'.

Figure 4:
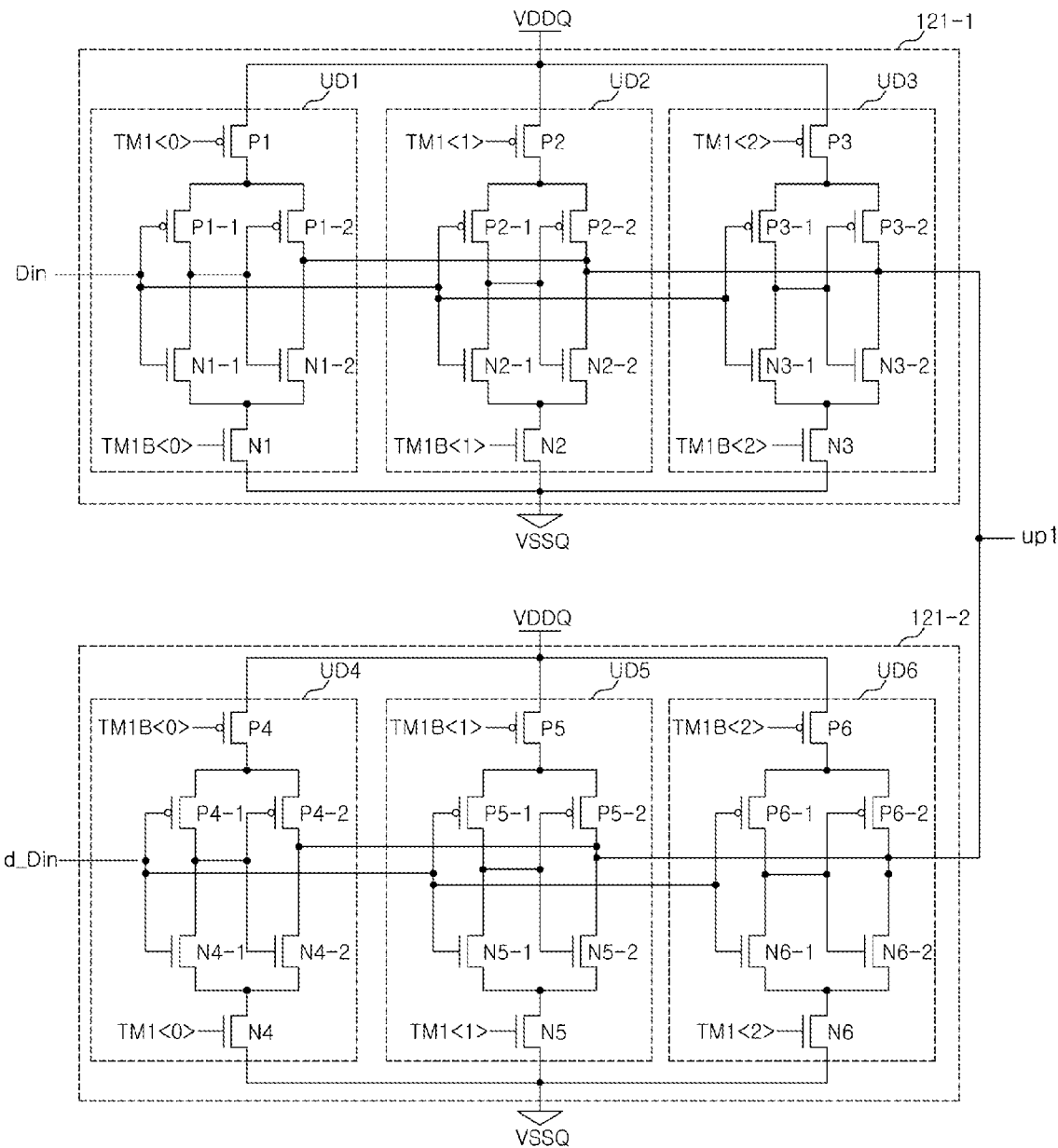
FIG. 4 is a schematic circuit diagram of an exemplary first phase mixer capable of being implemented in the first pre-driver circuit of FIG. 2 according to one embodiment.

FIG. 4 is a schematic circuit diagram of an exemplary first phase mixer capable of being implemented in the first pre-driver circuit of FIG. 2 according to one embodiment. In FIG. 4, the first phase mixer 121 can include a first driver 121-1 and a second driver 121-2. Here, the first driver 121-1 can apply a stress on the phase of the input data 'Din' in response to the first control signals 'TM1'. Similarly, the second driver 121-2 can apply a stress on the phase of the delayed input data 'd_Din' in response to the first control signals 'TM1'.

The first driver 121-1 can include a plurality of unit drivers UD, each having a configuration in which two tri-state inverters are connected to adjust the delay amount of the input data 'Din' so that a stress can be applied to the phase of the input data 'Din' in response to the first control signals 'TM1'. Similarly, the second driver 121-2 can include a plurality of unit drivers UD, each having a configuration in which two tri-state inverters are connected to adjust the delay amount of the delayed input data 'd_Din' so that a stress can be applied to the phase of the delayed input data 'd_Din' in response to the first control signals 'TM1'.

For example, the first control signals 'TM1' can be composed of a plurality of signal sets 'TM1<0:2>' and 'TM1B<0:2>'. The plurality of signal sets 'TM1<0:2>' and 'TM1B<0:2>' determine the turn-ON and turn-OFF of respective ones of the plurality of unit drivers UD1-UD6. When the first driver 121-1 includes first to third unit drivers UD1-UD3 and the second driver 121-2 includes fourth to sixth unit drivers UD4-UD6, the first control signals 'TM1' composed of the plurality of signal sets 'TM1<0:2>' and 'TM1B<0:2>' can determine the turn-ON and the turn-OFF of the first to sixth unit drivers UD1-UD6. For instance, when the first control signals 'TM1<0:2>' are composed of a set of signals having levels of 1, 0, and 0, in the first driver 121-1, the first unit driver UD1 can be turned OFF and the second and third unit drivers UD2 and UD3 can be turned ON. In addition, in the second driver 121-2, the fourth unit driver UD4 can be turned ON and the fifth and sixth unit drivers UD5 and UD6 can be turned OFF.

The first unit driver UD1 can include three PMOS transistors P1, P1-1, and P1-2 and three NMOS transistors N1, N1-1, and N1-2. Similarly, each of the second to sixth unit drivers UD2-UD6 can include three NMOS and three PMOS transistors. For example, the second unit driver can include NMOS and PMOS transistors N2, N2-1, N2-2, P2, P2-1, and P2-2, respectively, the third unit driver can include NMOS and PMOS transistors N3, N3-1, N3-2, P3, P3-1, and P3-2, respectively, the fourth unit driver can include NMOS and PMOS transistors N4, N4-1, N4-2, P4, P4-1, and P4-2, respectively, the fifth unit driver can include NMOS and PMOS transistors N5, N5-1, N5-2, P5, P5-1, and P5-2, respectively, and the sixth unit driver can include NMOS and PMOS transistors N6, N6-1, N6-2, P6, P6-1, and P6-2, respectively.

In FIG. 4, the first unit driver UD1 can include a first PMOS transistor P1 and a first NMOS transistor N1 that can perform switching functions, and first-first and first-second PMOS transistors P1-1 and P1-2 and first-first and first-second NMOS transistors N1-1 and N1-2 that can perform inverting functions. The turn-ON and turn-OFF of the first PMOS transistor P1 can be determined in response to a first signal 'TM1<0>' of the first control signals 'TM1', and can supply an external voltage 'VDDQ' to the first-first and first-second PMOS transistors P1-1 and P1-2. The turn-ON and turn-OFF of the first NMOS transistor N1 can be determined in response to a signal 'TM1B<0>' that is obtained by inverting the first signal 'TM1<0>' of the first control signals 'TM1', and can supply a ground voltage 'VSSQ' to the first-first and first-second NMOS transistors N1-1 and N1-2. Accordingly, the first unit driver UD1 can twice invert the input data 'Din' only when the first PMOS transistor P1 and the first NMOS transistor N1 are turned ON.

The fourth unit driver UD4 can include a fourth PMOS transistor P4 and a fourth NMOS transistor N4 that can perform switching functions, and fourth-first and fourth-second PMOS transistors P4-1 and P4-2 and fourth-first and fourth-second NMOS transistors N4-1 and N4-2 that can perform inverting functions. The turn-ON and turn-OFF of the fourth PMOS transistor P4 can be determined in response to the signal 'TM1B<0>' that is obtained by inverting the first signal 'TM1<0>' of the first control signals 'TM1', and can supply the external voltage 'VDDQ' to the fourth-first and fourth-second PMOS transistors P4-1 and P4-2. The turn-ON and turn-OFF of the fourth NMOS transistor N4 can be determined in response to the first signal 'TM1<0>' of the first control signals 'TM1', and can supply the ground voltage 'VSSQ' to the fourth-first and fourth-second NMOS transistors N4-1 and N4-2. Accordingly, the fourth unit driver UD4 can twice invert the delayed input data 'd_Din' only when the fourth PMOS transistor P4 and the fourth NMOS transistor N4 are turned ON.

The second unit driver UD2 can invert the output of the first unit driver UD1 in response to a second signal 'TM1<1>' of the first control signals 'TM1', and the third unit driver UD3 can invert the output of the second unit driver UD2 in response to a third signal 'TM1<2>' of the first control signals 'TM1'. The fifth unit driver UD5 can invert the output of the fourth unit driver UD4 in response to the second signal 'TM1<1>' of the first control signals 'TM1', and the sixth unit driver UD6 can invert the output of the fifth unit driver UD5 in response to the third signal 'TM1<2>' of the first control signals 'TM1'.

Since the second, third, and fourth phase mixers 122, 221, and 222 can also have substantially the same configuration as the first phase mixer 121, except that different signals are input thereto, the detailed configurations of the second, third, and fourth phase mixers 122, 221, and 222 are not illustrated in the drawings.

Figure 5:
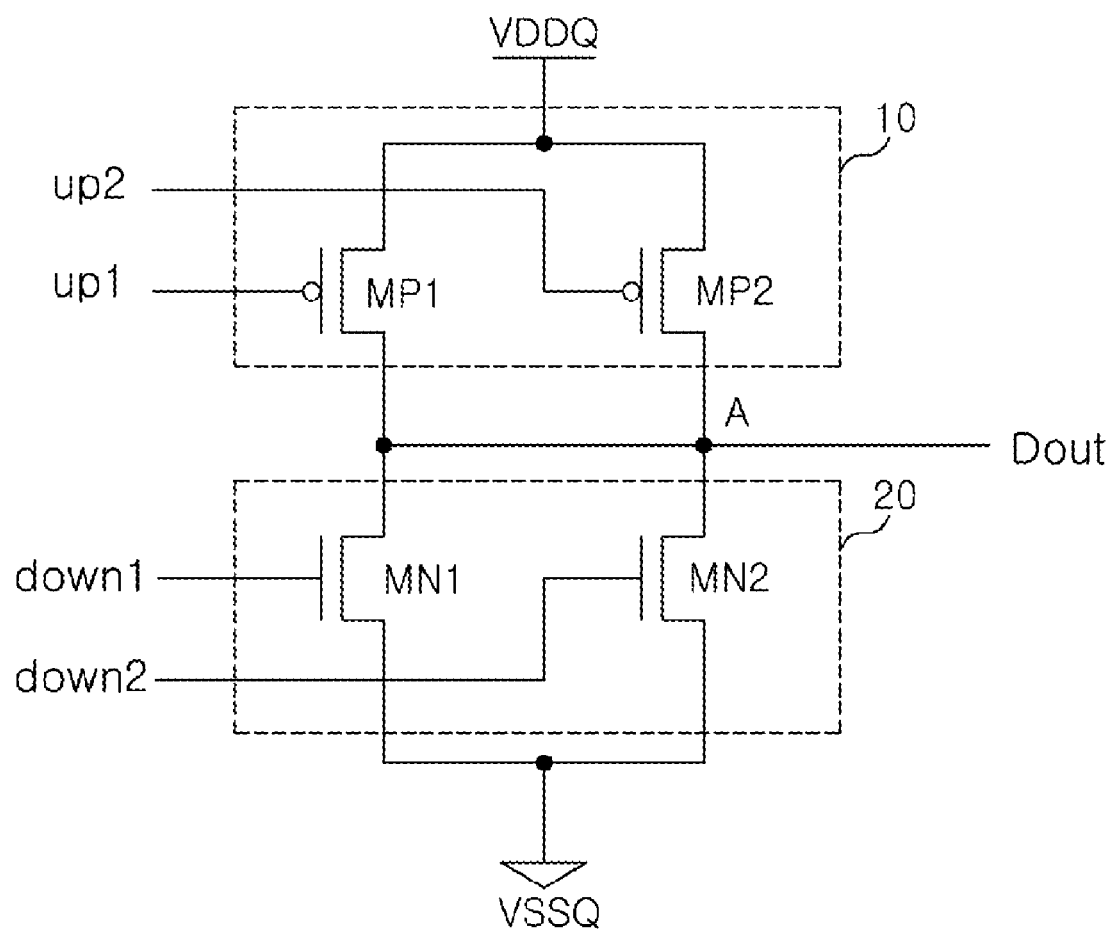
FIG. 5 is a schematic circuit diagram of an exemplary main driving block capable of being implemented in the circuit of FIG. 1 according to one embodiment.

FIG. 5 is a schematic circuit diagram of an exemplary main driving block capable of being implemented in the circuit of FIG. 1 according to one embodiment. In FIG. 5, the main driving block 2000 can be configured to include the pull-up driver 10 and the pull-down driver 20. Here, the pull-up driver 10 can include pull-up transistors MP1 and MP2, which can pull-up drive the output node A in response to the first and second pull-up signals 'up1' and 'up2', and the pull-down driver 20 which can include pull-down transistors MN1 and MN2, which can pull-down drive the output node A in response to the first and second pull-down signals 'down1' and 'down2'.

An exemplary operation of the data output circuit 1 will be described with reference to FIGS. 1-5. First, the case that the input data 'Din' has a low level will be described.

When the input data 'Din' has a low level, the output data 'Dout' gradually transitions from a low level to a high level. For example, the first delay section 110 can delay the input data 'Din' having the low level by the predetermined time, and can generate the delayed input data 'd_Din'. Then, the input data 'Din' having the low level and the delayed input data 'd_Din' can be input to the first and second phase mixers 121 and 122. In addition, the second delay section 210 can delay the input data 'Din' having the low level by the predetermined time, and can generate the delayed input data 'd_Din'. Moreover, the input data 'Din' and the delayed input data 'd_Din' can be input to the third and fourth phase mixers 221 and 222.

At this time, the first control signals 'TM1<0:2>' can include a set of signals having levels of 0, 0, and 0, the second control signals 'TM2<0:2>' can include a set of signals having levels of 1, 0, and 0, the third control signals 'TM3<0:2>' can include a set of signals having levels of 1, 1, and 0, and the fourth control signals 'TM4<0:2>' can include a set of signals having levels of 1, 1, and 1. Since the control signals 'TM1' to 'TM4' can include test mode signals using fuse sets or mode register set (MRS) signals, as described above, they can be adjusted.

Next, the first phase mixer 121 can receive the signals having the levels of 0, 0, and 0 as the first control signals 'TM1<0:2>'. Accordingly, the first to third unit drivers UD1-UD3 constituting the first driver 121-1 of the first phase mixer 121 can all be turned ON, and the fourth to sixth unit drivers UD4-UD6 constituting the second driver 121-2 of the first phase mixer 121 can be all turned OFF. Thus, the first phase mixer 121 can generate the first pull-up signal 'up1' that is enabled at substantially the same time as the phase of the input data 'Din'.

The second phase mixer 122 can receive the signals having the levels of 1, 1, and 0 as the third control signals 'TM3<0:2>'. Accordingly, the first and second unit drivers UD1 and UD2 constituting the first driver 122-1 of the second phase mixer 122 can be turned OFF, and the third unit driver UD3 can be turned ON. In addition, the fourth and fifth unit drivers UD4 and UD5 constituting the second driver 122-2 of the second phase mixer 122 can be turned ON, and the sixth unit driver UD6 can be turned OFF. Thus, the second phase mixer 122 can generate the second pull-up signal 'up2' that is enabled at a time corresponding to about two-thirds (⅔) of the phase difference between the input data 'Din' and the delayed input data 'd_Din'.

Similarly, because the third phase mixer 221 can receive the signals having the levels of 1, 0, and 0 as the second control signals 'TM2<0:2>', it can generate the first pull-down signal 'down1' that is enabled at a time corresponding to about one-third (⅓) of the phase difference between the input data 'Din' and the delayed input data 'd_Din'. Furthermore, because the fourth phase mixer 222 can receive the signals having the levels of 1, 1, and 1 as the fourth control signals 'TM4<0:2>', it can generate the second pull-down signal 'down2' that is enabled at substantially the same time as the phase of the delayed input data 'd_Din'. As a consequence, the pre-driving block 1000 can enable first of all the first pull-up signal 'up1' to a low level, and then sequentially enable the first pull-down signal 'down1', the second pull-up signal 'up2', and the second pull-down signal 'down2'.

For example, the first pull-up transistor MP1 of the main driving block 2000 can be first turned ON by receiving the first pull-up signal 'up1', the first pull-down transistor MN1 can be next turned OFF, the second pull-up transistor MP2 can be then turned ON, and the second pull-down transistor MN2 can be finally turned OFF. Accordingly, the output node A gradually transitions to a high level from a low level. Thus, by alternately enabling the pull-up signals 'up1' and 'up2' and the pull-down signals 'down1' and 'down2', the pull-up transistors MP1 and MP2 and the pull-down transistors MN1 and MN2 constituting the main driving block 2000 can be alternately turned ON and OFF. Accordingly, noise generation due to simultaneous switching of the transistors can be significantly reduced. Moreover, precise delay control is possible by freely changing the number of the unit drivers UD constituting the first pre-driver 100 and the second pre-driver 200 and the number of the input control signals 'TM'.

Second, the case that the input data 'Din' has a high level will be described.

When the input data 'Din' has a high level, the output data 'Dout' can gradually transition from a high level to a low level. Similarly, the input data 'Din' and the delayed input data 'd_Din' can be input to the first, second, third, and fourth phase mixers 121, 122, 221, and 222. At this time, while the levels of the first to fourth control signals 'TM1<0:2>' to 'TM4<0:2>' can be maintained, as described above, it is preferred that the first control signals 'TM1<0:2>' comprise a set of signals having levels of 1, 1, and 0, the second control signals 'TM2<0:2>' comprise a set of signals having levels of 0, 0, and 0, the third control signals 'TM3<0:2>' comprise a set of signals having levels of 1, 1, and 1, and the fourth control signals 'TM4<0:2>' comprise a set of signals having levels of 1, 0, and 0.

Accordingly, the first pull-down signal 'down1' is first enabled to a high level, wherein the first pull-up signal 'up1', the second pull-down signal ' down2' and the second pull-up signal 'up2' can be sequentially enabled. In response to the pull-up signals 'up1' and 'up2' and the pull-down signals ' down1' and ' down2', the first pull-down transistor MN1 can be first turned ON and can pull-down drive the output node A, the first pull-up transistor MP1 can be next turned OFF, the second pull-down transistor MN2 can then be turned ON, and the second pull-up transistor MP2 can be finally turned OFF. At this time, in a similar manner, noise generation due to simultaneous switching of the transistor can be significantly reduced.

When adjusting the turn-ON timing and the slew rate of a main driving block, an RC delay control does not need to be used. Instead, by using phase mixers, precise delay control becomes possible, the bandwidths of pre-drivers do not decrease, and the data output circuit can be applied for high speed operation. In addition, noise generation due to switching can be significantly reduced.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A data output buffer circuit, comprising:
   a pre-driving block configured to generate a plurality of pull-up signals and pull-down signals in response to input data and change enable times of the pull-up signals and the pull-down signals in response to a plurality of control signals; and
   a main driving block configured to generate output data in response to the pull-up signals and the pull-down signals,
   wherein the pre-driving block comprises:
      a delay section configured to delay the input data by a predetermined time and generate delayed input data; and
      a phase mixing section configured to receive the input data, the delayed input data, and the plurality of control signals and generate the plurality of pull-up signals and pull-down signals.

2. The data output buffer circuit according to claim 1, wherein the pull-up phase mixing section includes a plurality of phase mixers configured to receive the input data, the delayed input data, and the plurality of control signals and generate the respective pull-up signals and pull-down signals.

3. The data output buffer circuit according to claim 2, wherein each of the plurality of phase mixers includes a first driver configured to adjust a delay amount of the input data in response to corresponding control signals of the plurality of control signals, and a second driver configured to adjust a delay amount of the delayed input data in response to corresponding control signals of the plurality of control signals,
   wherein each of the plurality of phase mixers mixes output of the first driver and output of the second driver, and generates a corresponding pull-up signal.

4. The data output buffer circuit according to claim 1, wherein the main driving block includes a pull-up driver configured to pull-up drive an output node in response to the plurality of pull-up signals, and a pull-down driver configured to pull-down drive the output node in response to the plurality of pull-down signals, and wherein the output data is generated through the output node.

5. A data output buffer circuit, comprising:
   a first pre-driver configured to generate first and second pull-up signals in response to input data and determine enable times of the first and second pull-up signals in response to first and third control signals;
   a second pre-driver configured to generate first and second pull-down signals in response to the input data, and determine enable times of the first and second pull-down signals in response to second and fourth control signals; and
   a main driving block configured to drive an output node in response to the first and second pull-up signals and the first and second pull-down signals, and generate output data through the output node,
   wherein the first pre-driver comprises:
      a delay section configured to delay the input data by a predetermined time and generate delayed input data; and
      a pull-up phase mixing section configured to receive the input data, the delayed input data, and the first and third control signals and generate the first and second pull-up signals.

6. The data output buffer circuit according to claim 5, wherein the first pull-up signal is enabled first, and then the first pull-down signal, the second pull-up signal and the second pull-down signal are sequentially enabled when the output node transitions from a first level to a second level.

7. The data output buffer circuit according to claim 5, wherein the first pull-down signal is enabled first, and then the first pull-up signal, the second pull-down signal and the second pull-up signal are sequentially enabled when the output node transits transitions from the second level to the first level.

8. The data output buffer circuit according to claim 5, wherein the pull-up phase mixing section comprises:
   a first phase mixer configured to receive the input data, the delayed input data, and the first control signal and generate the first pull-up signal; and
   a second phase mixer configured to receive the input data, the delayed input data, and the third control signal and generate the second pull-up signal.

9. The data output buffer circuit according to claim 8, wherein each of the first and second phase mixers includes a first driver configured to adjust a delay amount of the input data in response to the first and third control signals, and a second driver configured to adjust a delay amount of the delayed input data in response to the first and third control signals, mixed output of the first driver and output of the second driver, and generate each of the first and second pull-up signals.

10. The data output buffer circuit according to claim 5, wherein the second pre-driver comprises:
    a delay section configured to delay the input data by a predetermined time and generate delayed input data; and a pull-down phase mixing section configured to receive the input data, the delayed input data, and the second and fourth control signals and generate the first and second pull-down signals.

11. The data output buffer circuit according to claim 10, wherein the pull-down phase mixing section comprises:

a first phase mixer configured to receive the input data, the delayed input data, and the second control signal and generate the first pull-down signal; and a second phase mixer configured to receive the input data, the delayed input data, and the fourth control signal and generate the second pull-down signal.

12. The data output buffer circuit according to claim 11, wherein each of the first and second phase mixers includes a first driver configured to adjust a delay amount of the input data in response to the second and fourth control signals, and a second driver configured to adjust a delay amount of the delayed input data in response to the second and fourth control signals, mix output of the first driver and output of the second driver, and generate each of the first and second pull-down signals.

13. The data output buffer circuit according to claim 5, wherein the main driving block includes a pull-up driver configured to pull-up drive the output node in response to the first and second pull-up signals, and a pull-down driver configured to pull-down drive the output node in response to the first and second pull-down signals, and wherein the output data is generated through the output node.

14. The data output buffer circuit according to claim 13, wherein the pull-up driver includes first and second pull-up transistors configured to pull-up drive the output node in response to the first and second pull-up signals.

15. The data output buffer circuit according to claim 13, wherein the pull-down driver includes first and second pull-down transistors configured to pull-down drive the output node in response to the first and second pull-down signals.

* * * * *